United States Patent
Chen et al.

(10) Patent No.: US 12,136,461 B2
(45) Date of Patent: Nov. 5, 2024

(54) MEMORY PROGRAMMING OPERATION COMPRISING PREPROGRAMMING MEMORY CELLS

(71) Applicant: Macronix International Co., Ltd., Hsinchu (TW)

(72) Inventors: Che-Ping Chen, Taipei (TW); Ya-Jui Lee, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 17/394,850

(22) Filed: Aug. 5, 2021

(65) Prior Publication Data
US 2023/0041949 A1 Feb. 9, 2023

(51) Int. Cl.
*G11C 16/34* (2006.01)
*G11C 16/10* (2006.01)
*G11C 16/26* (2006.01)

(52) U.S. Cl.
CPC ........ *G11C 16/3459* (2013.01); *G11C 16/102* (2013.01); *G11C 16/26* (2013.01); *G11C 16/3409* (2013.01)

(58) Field of Classification Search
CPC ....... G11C 16/06; G11C 16/10; G11C 16/107; G11C 16/12; G11C 16/24; G11C 16/34; G11C 16/3436; G11C 16/3454; G11C 16/3459; G11C 16/3463; G11C 16/3481
See application file for complete search history.

(56) References Cited

U.S. PATENT DOCUMENTS

| | | | | |
|---|---|---|---|---|
| 6,807,100 | B2 * | 10/2004 | Tanaka | G11C 16/10 365/185.24 |
| 8,854,879 | B2 * | 10/2014 | Shim | G11C 11/5628 365/185.29 |
| 8,923,046 | B2 * | 12/2014 | Noh | G11C 11/5628 365/185.11 |
| 9,224,478 | B2 * | 12/2015 | Eguchi | G11C 7/04 |
| 9,916,900 | B2 * | 3/2018 | Kim | G11C 16/107 |
| 10,147,491 | B2 * | 12/2018 | Lee | G11C 11/5628 |
| 10,163,511 | B2 * | 12/2018 | Nam | G11C 11/4099 |

(Continued)

FOREIGN PATENT DOCUMENTS

TW I650769 B 2/2019
TW I704455 B 9/2020

*Primary Examiner* — Alfredo Bermudez Lozada
(74) *Attorney, Agent, or Firm* — Fish & Richardson P.C.

(57) ABSTRACT

A memory controller receives a command to program information to a memory storage array controlled by the memory controller. The memory controller determines a target memory state to store the information, and a target threshold voltage level corresponding to the target memory state. Based at least on the target memory state, the memory controller determines one or more program pulses for a pre-program cycle, including voltage levels for the one or more program pulses based at least on the target threshold voltage level. The memory controller selects a memory location in the memory storage array to program the information, and pre-programs the selected memory location by applying the one or more program pulses at respective voltage levels, the one or more program pulses applied without program verify operations. Following the pre-programming, the memory controller programs the information to the selected memory location.

21 Claims, 9 Drawing Sheets

(56) References Cited

U.S. PATENT DOCUMENTS

| | | | |
|---|---|---|---|
| 11,461,035 B2 * | 10/2022 | Venkataraman | ...... G06F 3/0652 |
| 2009/0080263 A1 | 3/2009 | Lee et al. | |
| 2013/0155773 A1 | 6/2013 | Miyamoto | |
| 2016/0092130 A1 | 3/2016 | Choi et al. | |
| 2016/0148693 A1 * | 5/2016 | Lee | ..................... G11C 11/5628 |
| | | | 365/185.11 |
| 2021/0134359 A1 * | 5/2021 | Park | .................. H01L 27/11556 |

* cited by examiner

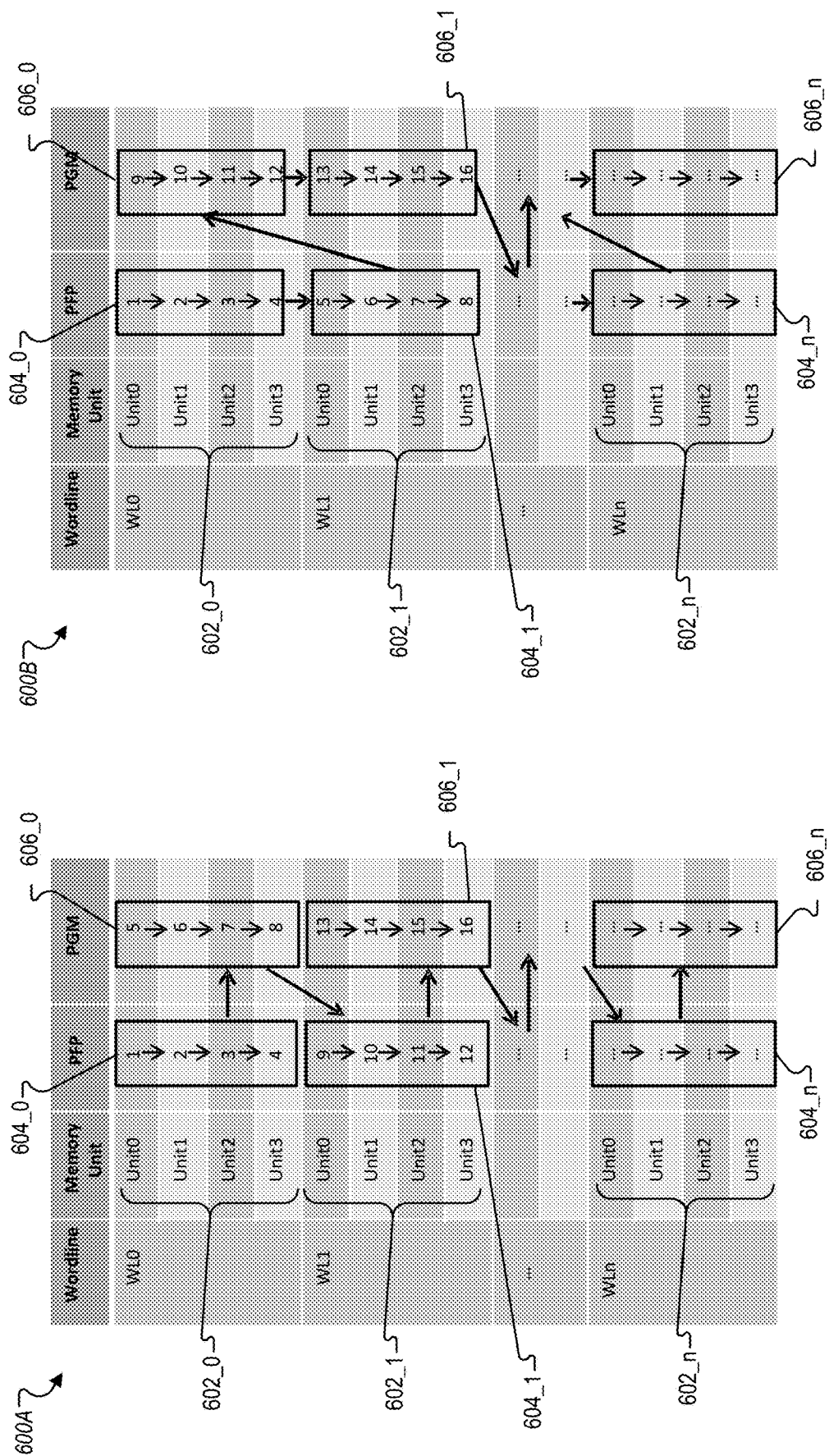

MEMORY PROGRAMMING OPERATION COMPRISING PREPROGRAMMING MEMORY CELLS

TECHNICAL FIELD

The following disclosure relates generally to memory devices, and in particular, to methods, apparatus and systems related to programming semiconductor memory devices for threshold voltage distribution.

BACKGROUND

A semiconductor memory device includes storage memory, for example, flash memory, and a memory controller that manages the storage memory. The memory controller receives commands from a host device to perform operations on data stored in the storage memory.

SUMMARY

The present disclosure describes methods, apparatus and systems to tighten the threshold voltage (VT) distribution in a semiconductor memory device, leading to improved performance of the memory device, for example, accurate read performance with low bit error rate. The memory device includes a memory storage array with one or more arrays of memory cells for storing data, and a memory controller to manage access to the storage memory, for example, upon receiving read or program/write commands from a host device that is coupled to the memory device. Upon receiving a command to program data to the memory device, the memory controller performs a pre-filled program (PFP) cycle on a target memory location, for example, a memory block, sub-block or page, before programming data to the memory location using conventional programming. In a PFP cycle, the memory controller pre-programs one or more memory cells of the target memory location by applying one or more program pulses to the memory cells, but without performing any accompanying program verify (PV) operations. Using the PFP cycle, electrons are pre-filled into the trapping layer of a memory cell. These pre-filled electrons redistribute or spread out in the trapping layer following the PFP cycle. Subsequently, electrons that are programmed in a conventional program (PGM) cycle are inhibited from redistributing due to being repelled by the pre-filled electrons, which results in a reduction in the number of program/data electrons that spread out upon completion of the PGM cycle. Accordingly, the VT distribution due to program/data electrons spreading out is tightened (for example, limited or reduced), leading to improved read performance of the memory device.

In a general aspect, a memory controller performs a method that comprises receiving a command to program information to a memory storage array controlled by the memory controller; determining a target memory state to store the information, and a target threshold voltage level corresponding to the target memory state; determining, based at least on the target memory state, one or more program pulses for a pre-program cycle, including determining voltage levels for the one or more program pulses based at least on the target threshold voltage level; selecting a memory location in the memory storage array to program the information; pre-programming the selected memory location by applying the one or more program pulses at respective voltage levels, the one or more program pulses applied without program verify operations; and following the pre-programming, programming the information to the selected memory location.

Particular implementations may include one or more of the following features. In some implementations, programming the information to the selected memory location comprises applying one or more additional program pulses to the selected memory location to reach the target threshold voltage level, the one or more additional program pulses applied with respective accompanying program verify operations.

In some implementations, computing voltage levels for the one or more program pulses based at least on the target threshold voltage level comprises determining the voltage levels for the one or more program pulses to be less than the target threshold voltage level. In some implementations, the voltage levels for the one or more program pulses are determined to be within a specified range of the target threshold voltage level.

In some implementations, the method comprises receiving a second command to program second information to the memory storage array; determining a plurality of target memory states to store the second information, the plurality of target memory states including a first memory state and a second memory state; determining a plurality of target threshold voltage levels corresponding to the plurality of target memory states, the plurality of target threshold voltage levels including a first target voltage level corresponding to the first memory state and a second target voltage level corresponding to the second memory state, the second target voltage level being higher than the first target voltage level; determining, based at least on the plurality of target memory states, one or more second program pulses, the one or more second program pulses including a combined program pulse for pre-programming the first memory state and the second memory state; computing, based at least on the plurality of target threshold voltage levels, voltage levels for the one or more second program pulses, including a first voltage level for the combined program pulse; selecting a second memory location in the memory storage array to program the second information; pre-programming the second memory location by applying the one or more second program pulses at respective voltage levels, including applying the combined program pulse at the first voltage level to pre-program the second memory location for the first memory state and the second memory state, the one or more second program pulses applied without program verify operations; and following pre-programming the second memory location, programming the information to the second memory location.

In some implementations, the first voltage level is less than the first target voltage level, and the first voltage level is within a specified range of the first target voltage level. In some implementations, a threshold voltage of the selected memory location upon completion of the pre-programming is determined to be less than the first target voltage level and within a specified range of the first target voltage level.

In some implementations, the selected memory location includes a first memory block associated with a first word line and a second memory block associated with a second word line. In such implementations, pre-programming the selected memory location and programming the information to the selected memory location comprises: pre-programming the first memory block by applying the one or more program pulses at respective voltage levels, the one or more program pulses applied without program verify operations; following pre-programming the first memory block, programming the information to the first memory block; following programming the information to the first memory block, pre-programming the second memory block by applying the one or more program pulses at respective voltage levels, the one or more program pulses applied without program verify operations; and following pre-programming the second memory block, programming the information to the second memory block.

In some implementations, each of the first memory block and the second memory block respectively comprises a plurality of first memory units and second memory units. In such implementations, pre-programming and programming the first memory block and the second memory block comprises pre-programming the plurality of first memory units by applying the one or more program pulses at respective voltage levels, the one or more program pulses applied without program verify operations; following pre-programming the plurality of first memory units, programming the information to the plurality of first memory units; following programming the information to the plurality of first memory units, pre-programming the plurality of second memory units by applying the one or more program pulses at respective voltage levels, the one or more program pulses applied without program verify operations; and following pre-programming the plurality of second memory units, programming the information to the plurality of second memory units.

In some implementations, each of the first memory block and the second memory block respectively comprises a plurality of first memory units and second memory units. In such implementations, pre-programming and programming the first memory block and the second memory block comprises pre-programming the plurality of first memory units by applying the one or more program pulses at respective voltage levels, the one or more program pulses applied without program verify operations; following pre-programming the plurality of first memory units, pre-programming the plurality of second memory units by applying the one or more program pulses at respective voltage levels, the one or more program pulses applied without program verify operations; following pre-programming the plurality of second memory units, programming the information to the plurality of first memory units; and following programming the information to the plurality of first memory units, programming the information to the plurality of second memory units.

Implementations include a memory device comprising a memory storage array including one or more memory blocks, with at least one of the memory blocks including one or more memory units, and a memory controller to manage access to the memory storage array, wherein the memory controller is configured to perform the above-described operations. Implementations also include a memory controller to manage a memory storage array in a memory device, where the memory controller comprises one or more processors and one or more machine-readable media storing instructions that, when executed, cause the one or more processors to perform the above-described operations.

Implementations further include non-transitory computer-readable media and systems. One such non-transitory computer-readable medium stores instructions that, when executed, cause one or more processors to perform the above-described operations. One such system includes a memory device with a memory controller to manage access to one or more memory cell arrays in the memory device, wherein the memory controller is configured to perform the above-described operations. In some implementations, one such system includes a host device communicably coupled to memory device and configured to access the memory cell arrays. In such implementations, the memory controller is configured to perform the disclosed PFP cycles upon receiving program commands from the host device.

Using the novel features described above and in the following sections of this specification, the performance (for example, memory read performance) of semiconductor memory devices, such as flash memory devices, can be improved. In conventional memory devices, the VT redistribution can cause the VT range for a program state of a memory cell to encroach on the VT range of a neighboring program state. This encroachment or overlap can cause a read operation to return an incorrect result, for example, the value corresponding to the neighboring program state. Some schemes attempt to address the issue of VT distribution using additional PV operations, which can add significant delay to the program operation and degrade the overall performance of the memory device.

In contrast, using the disclosed techniques of PFP cycles, the VT redistribution is reduced, such the read operations return accurate results. The PFP cycles do not use PV operations, thus resulting in shorter program time compared to the other schemes. The disclosed techniques thus improve (for example, by tightening) VT distribution for the memory devices with better performance (for example, shorter program time) compared to other schemes.

The disclosed techniques can be applied to various types of non-volatile memory devices. For example, the disclosed techniques can be applied to NAND flash memory, including 2-dimensional (2D) and 3-dimensional (3D) NAND memory, NOR flash memory, or phase change memory (PCM), among others. Additionally or alternatively, the techniques can be applied to various types of main or cache memory devices, such as resistive random access memory (ReRAM), or MRAM, among others. For the various memory technologies, the disclosed techniques can be applied to memory arrays with different types of memory cells, including single-level cells (SLCs), multi-level cells (MLCs), triple-level cells (TLCs) and quad-level cells (QLCs), among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 6A-6D illustrate examples of different sequences of memory unit selection during programming operations involving pre-filled program (PFP) cycles.

Like reference numbers in the figures indicate like elements.

DETAILED DESCRIPTION

Figure 1:
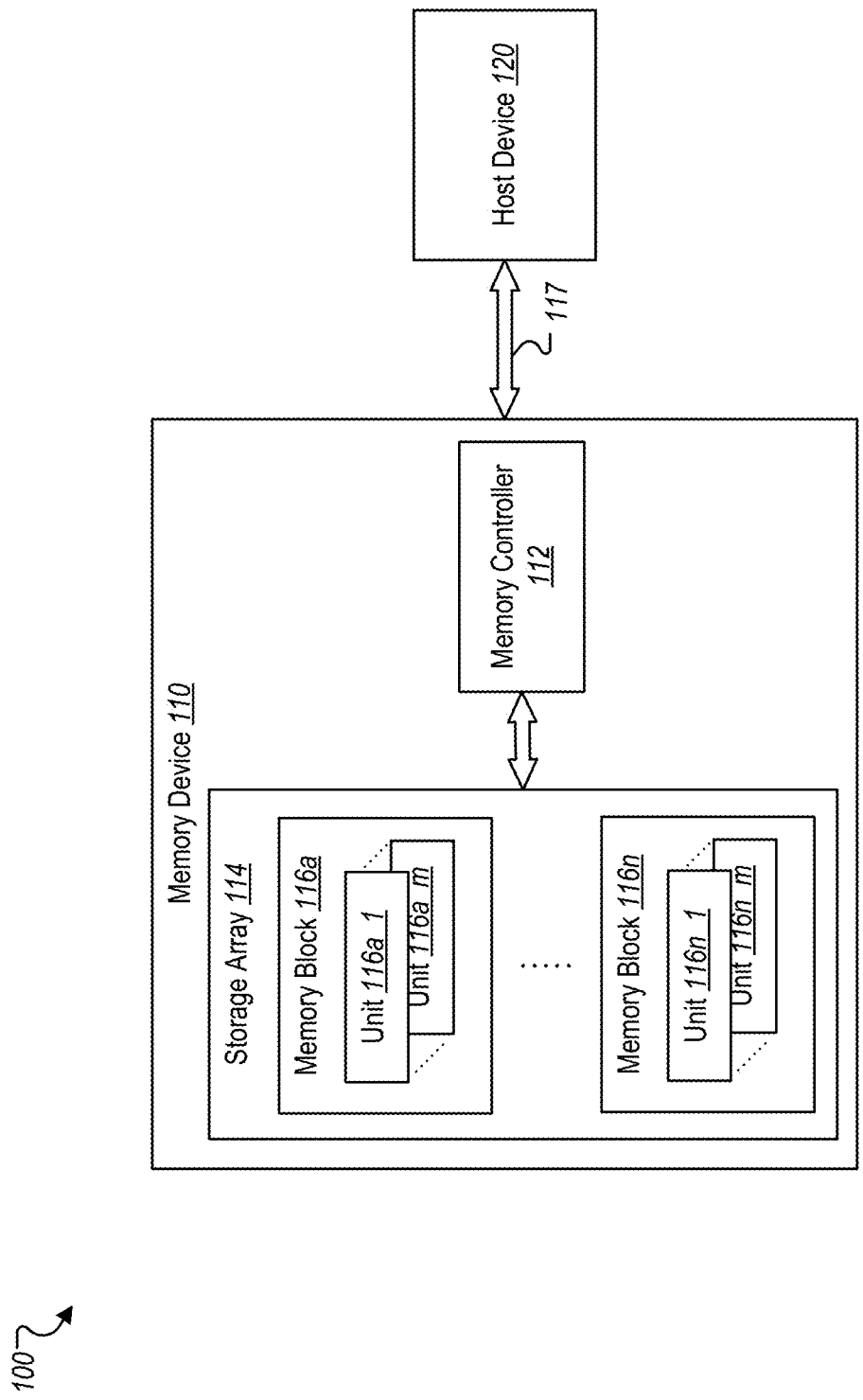
FIG. 1 illustrates a block diagram of an example system that uses a pre filled program (PFP) cycle during a memory programming operation for a memory device, according to some implementations.

FIG. 1 illustrates a block diagram of an example system 100 that uses a pre-filled program (PFP) cycle during a memory programming operation for a memory device. The system 100 includes a memory device 110 that is coupled to a host device 120 using a bus 117. The memory device 110 includes a memory controller 112, and a memory storage array 114 that stores data and other information.

In some implementations, the memory device 110 is a memory storage device. As illustrative examples, the memory device 110 can be an embedded multimedia card (eMMC), a secure digital (SD) card, a solid-state drive (SSD), laptop or desktop computer memory, or some other suitable storage. In some implementations, the memory device 110 is a client device that is coupled to a host device 120. For example, the memory device 110 can be an SD card that is coupled to a digital camera or a media player as the host device 120.

The memory controller 112 manages access to, and operations performed on, the storage array 114. The following sections describe the various techniques based on implementations in which the memory controller 112 is used to manage read and write operations performed on the storage array 114. However, the techniques described in the following sections are also applicable in implementations in which another type of controller in the memory device 110, different from a memory controller, is used to manage operations on the storage array 114.

In some implementations, the storage array 114 is a non-volatile memory, for example, a NAND or NOR flash memory, or some other suitable non-volatile memory. In implementations where the storage array 114 is NAND or NOR flash memory, the memory device 110 is a flash memory device, for example, a flash memory card, and the memory controller 112 is a flash controller. For example, in some cases, the memory device 110 is a Serial Peripheral Interface (SPI) device, with the storage memory being NOR or NAND flash memory. For illustration purposes, the following description uses a flash memory as an example of the storage array 114.

As shown, the storage array 114 includes a plurality of memory blocks, memory blocks 116a to 116n. A memory block in turn includes one or more memory units. For example, memory block 116a includes memory units 116a_1, . . . , 116a_m; and memory block 116n includes memory units 116n_1, . . . , 116n_m. In some implementations, a memory unit is a memory sub-block. In other implementations, a memory unit is a memory page.

A memory unit is composed of one or more memory cells. The memory blocks and constituent memory units are configured to store data or instructions, or both in the memory cells, for use by the host device 120. The memory cells can include single-level cells (SLCs), multi-level cells (MLCs), triple-level cells (TLCs), quad-level cells (QLCs), or a higher level memory cell beyond QLC, or any combination of these. An SLC stores one bit of data per memory cell; an MLC stores two bits of data per memory cell; a TLC stores three bits of data per memory cell; a QLC stores four bits of data per memory cell; and a higher level memory cell beyond QLC stores five or more bits of data per memory cell.

The memory controller 112 is a general-purpose microprocessor or microcontroller, or an application specific integrated circuit (ASIC) chip, among other suitable types. The memory controller 112 receives program (for example, write) or read commands from the host device 112 through the bus 117, and accordingly performs program or read operations, respectively, on the storage array 114.

In some implementations, the memory controller 112 performs PFP operations upon receiving a program command from the host device 120. As described in detail below, upon receiving a program command, the memory controller 112 identifies a memory location, for example, a memory block, sub-block or page, to program the data, and performs PFP operations on one or more memory cell(s) of the memory location, before writing the data to the memory cell(s) using conventional program operations. In some implementations, the memory controller 112 performs PFP operations using the disclosed techniques at the granularity of memory blocks, such as memory blocks 116a or 116n. In other implementations, the memory controller 112 performs the PFP operations using the disclosed techniques at the granularity of memory units (memory sub-blocks or memory pages), such as memory units 116a_1, 116a_m, 116n_1, or 116n_m. The PFP operations can also be performed at a different granularity of the target memory location in the storage array 114, such as memory chunks or memory cells, among others. PFP operations performed using the disclosed techniques are described in the following sections with respect to the system 100.

Figure 2A:
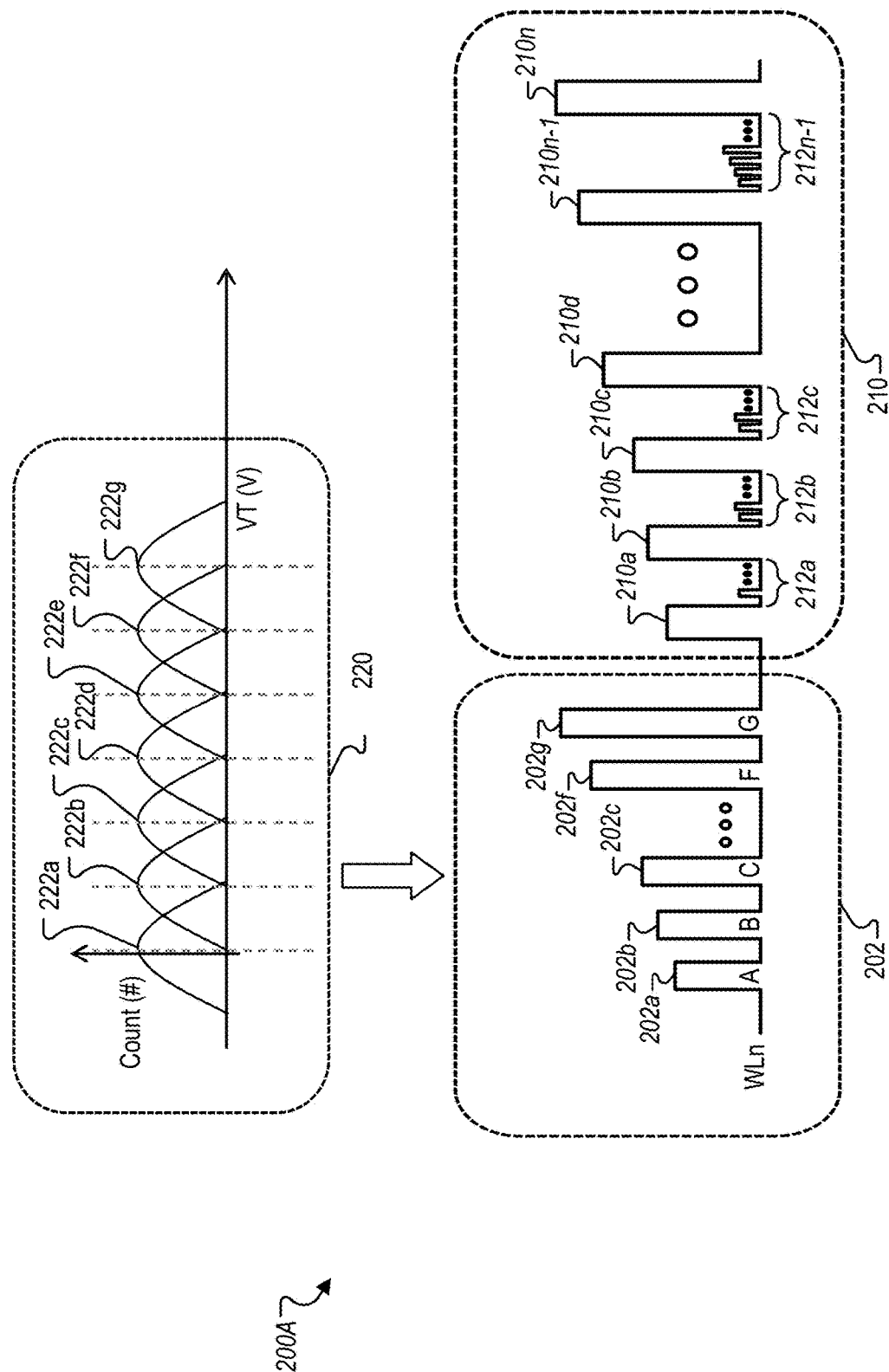
FIGS. 2A and 2B illustrate examples of memory programming operations with pre-filled program (PFP) cycles preceding conventional program (PGM) cycles, according to some implementations.
Figure 2B:
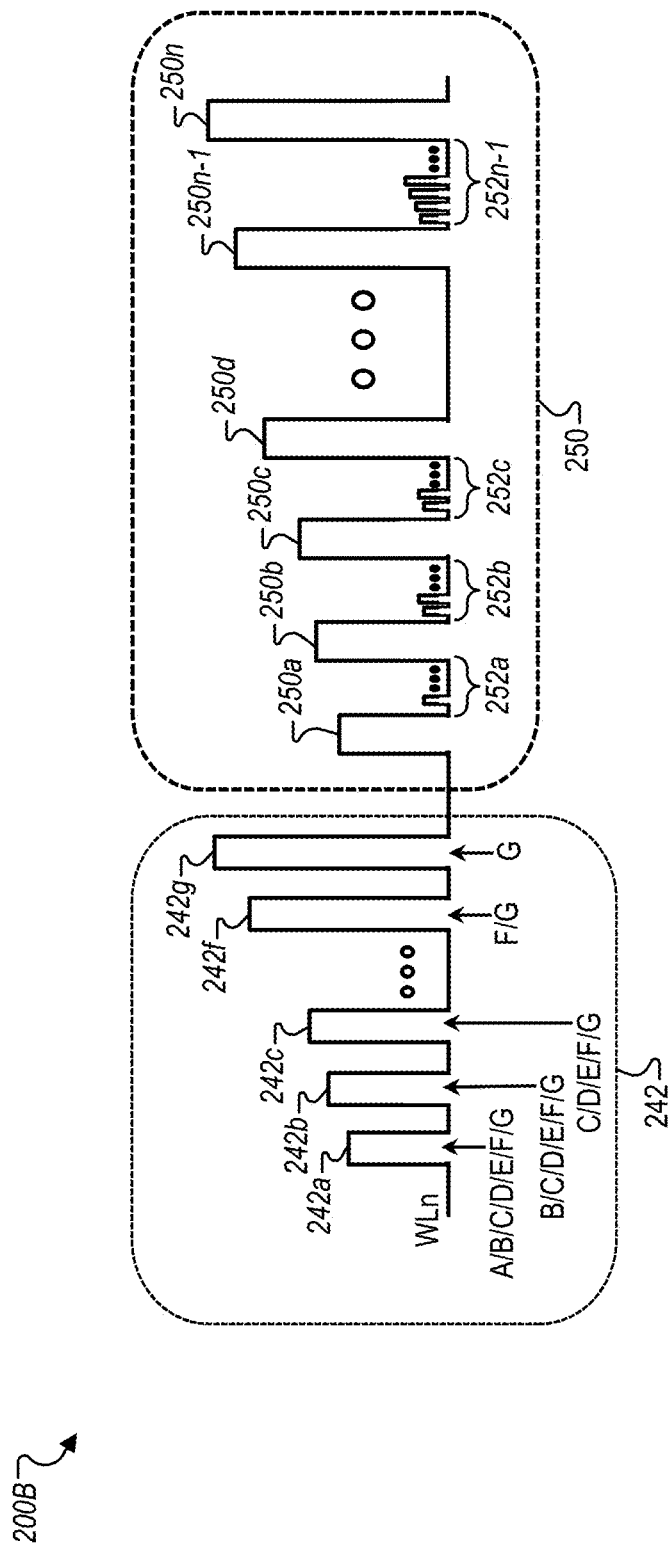

FIGS. 2A and 2B illustrate examples of memory programming operations 200A and 200B, respectively, with pre-filled program (PFP) cycles 202 and 242, respectively, preceding conventional program (PGM) cycles 210 and 250, respectively. In some implementations, the programing operations 200A and 200B are performed by the memory controller 112 to program data to a target memory location in the storage array 114 upon receiving a program command from the host device 120, and the following descriptions are with respect to operations performed by the memory controller 112. However, in other implementations, the programming operation 200A or 200B, or both, may be performed by other hardware and/or software in a system associated with a memory array that is programmed.

The memory controller programs a memory location, for example writes data to or erases data from a constituent memory cell, by applying a set of voltage pulses, which are referred to as programming pulses or shots, to the memory cell in a program cycle. The programming pulses are applied to reach a target threshold voltage (VT) level for the memory cell. When writing to the memory cell, the target VT level corresponds to a voltage level state of the memory cell that represents the bits of data to be written to the memory cell. When erasing data from the memory cell, the target VT level corresponds to a voltage level state to reset the memory cell to an erased state.

The voltage level of each programming pulse can be a fraction of the target VT level. FIG. 2A shows the PFP cycle 202 and the PGM cycle 210 with respect to a memory cell associated with word line WLn. In the PGM cycle 210, after each programming pulse, a PV operation is performed to determine whether the target VT is reached and, accordingly, whether data was correctly written to or erased from the memory cell. If the target VT level is not reached, another programming pulse is applied to adjust the voltage level in the memory cell towards the target VT level, followed by a PV operation. For example, programming pulse 210a is followed by PV operation 212a, programming pulse 210b is followed by PV operation 212b, programming shot 210c is followed by PV operation 212c and programming shot 210n-1 is followed by PV operation 212n-1. The process is repeated until the target VT level is reached for the memory cell.

Preceding the conventional programming cycle 210, the memory controller performs the PFP cycle 202, in which the memory controller applies PFP pulses (that is, programming pulses or shots) 202a, 202b, 202c, 202f or 202g, to the target memory cell, without applying any program verify (PV) pulses. For example, there are no PV pulses applied after PFP pulses 202a, 202b, 202c, 202f, or 202g. In contrast, as described above, in the PGM cycle 210, the memory controller performs a program verify operation by applying PV pulses after each programming pulse. For example, the memory controller applies PV pulses 212a, 212b, 212c and 212n-1 respectively after the programming pulses 210a, 210b, 210c, and 210n-1. Since the PFP pulses are applied without PV, the additional program time that would have been used for PV operations is eliminated in the PFP cycle. Accordingly, the time to perform PFP cycle 202 is low, compared to schemes that use PV operations. In some cases, the PFP cycle 202 is referred to as a dumb program cycle, due to the lack of PV after programming pulses.

As noted previously, a memory cell has a number of target VT levels that correspond to voltage levels for a number of states to store data (for example, bit values) in the cell. For example, SLC, MLC, TLC and QLC respectively have two, four, eight and sixteen target VT levels. Without loss of generality, programming operation 200A is illustrated with respect to a TLC, which has a zero state (for example, the erase state), referred to as state 1, and seven non-zero states referred to as states A, B, C, D, E, F, and G, with corresponding seven target VT levels. VT distribution graph 220 illustrates distribution curves for VT levels corresponding to the PFP cycle 202 for the different states. For example, PFP curve 222a corresponds to the VT distribution for PFP pulse 202a. Similarly, PFP curves 222b, 222c, 222d, 222e, 222f, and 222g respectively corresponds to the VT distribution for PFP pulses 202b, 202c, 202d, 202e, 202f, and 202g.

During the PFP cycle 202, the memory controller applies a PFP pulse that corresponds to the VT level for the target state for the memory cell, which is determined based on the data to be programmed (for example, the target state is respectively state B or state C if the value "010" or "011" is to be stored in a TLC cell). To illustrate, the memory controller can determine that the target state for memory cell to store data "010" is state B. In this case, the target VT level for the PFP cycle 202 corresponds to the distribution curve 222b, and the memory controller applies the PFP pulse 202b to reach the target VT level for curve 222b. Subsequently, during the PGM cycle 210, the memory controller applies the programming pulse 210b, followed by PV 212b, to store data in the memory cell in state B.

As shown, the PFP cycle 202 includes separate PFP pulses for each different state of the memory cell. For example, PFP pulses 202a, 202b, 202c, 202f, and 202g are respectively applied to reach target VT levels for states A, B, C, F, and G. By having separate PFP pulses for separate states, the width of the VT distribution curves can be improved. The PFP cycle 202 corresponds to implementations in which the memory controller 112 applies a single PFP pulse to reach the VT level for the target state, directly from the erase state. For example, to reach the state F, a single PFP pulse 202f, with a voltage level that is close to the target VT level for state F, is applied directly from the erase state.

In some implementations, the memory controller 112 applies multiple PFP pulses to reach the VT level for the target state. For example, in such cases, two or more pulses incrementally increasing in intensity, can be applied to reach the target state. By applying multiple pulses that incrementally increase in intensity, better window is achieved in obtaining the VT level. FIG. 2B shows a programming operation 200B for one such implementation, in which PFP cycle 242 precedes a PGM cycle 250.

In the PFP cycle 242, one or more PFP pulses are applied to teach the target VT level of a particular state of a memory cell. For example, to pre-fill program state A for a memory cell, PFP pulse 242a is applied. However, to pre-fill program state B for a memory cell, first PFP pulse 242a is applied to cause the VT level of the memory cell change from the erase state to a VT level near that of state A, and then a second PFP pulse 242b, incrementally greater in intensity compared to pulse 242a, is applied to cause the VT level of the memory cell to increase further to be near the target VT level of state B. Since the PFP pulse 242a, corresponding to state A, has a lower level than the VT level of state B, there is no concern about over-programming when using PFP pulse 242a to pre-fill program a memory cell to state B (or other higher states, such as states C, D, E, F, or G). However, the PFP pulse 242b, corresponding to state B, has a higher level than the VT level of state A, and cannot be used to pre-fill program a memory cell to state A, as that would be over-program for state A.

Similarly, to pre-fill program a memory cell to the VT level of state C, PFP pulse 242a is first applied to the memory cell to reach the VT level of state A from an erase state; then PFP pulse 242b is applied to move the VT level higher to that of state B; and finally PFP pulse 242c is applied to reach the target VT level corresponding to state C. Likewise, to pre-fill program to state F, PFP pulses 242a, 242b, 242c, up to PFP pulse 242f are applied in successive operations; and to pre-fill program to state G, PFP pulses 242a, 242b, 242c, up to PFP pulse 242f, and finally PFP pulse 242g, are applied in successive operations.

Accordingly, using the PFP cycle 242, a memory cell is pre-fill programmed to a target state in stepwise increments, starting from the lowest state and moving to the next higher state with each PFP pulse, until the VT level of the target state is reached. The PGM cycle 250, however, is similar to the PGM cycle 210, with application of programming pulses 250a, 250b, 250c, 250d, 250n-1, and 250n, each followed by PV pulses, e.g., 252a, 252b, 252c and 252n-1.

In some implementations, whether a single PFP pulse is used (as in PFP cycle 202), or multiple PFP pulses are used (as in PFP cycle 242) to reach the VT level for a target state is modifiable depending on a programming option. This is achieved by providing different program commands for the bit line (BL) signal. For example, using a single PFP pulse to reach state F for a memory cell can be performed by providing the program (PGM) command, "BL with F state pattern join PGM (force 0V)". In contrast, using multiple PFP pulses to reach state F can be performed by providing the program (PGM) command, "BL with A/B/C/D/E/F states pattern join PGM (force 0V)."

In some implementations, levels of the PFP pulses are determined such that the corresponding VT level of the memory cell after application of a PFP pulse is close to, but less than, the PV level for the actual programming operation. In such implementations, the PFP pulse levels are determined to achieve respective VT levels after PFP pulse application that are within a specified range of the PV level for the actual programming operation. The PFP pulse levels are selected to be within the specified ranges to avoid over-programming the memory cell, for example, to avoid the VT level following the PFP operation exceeding the PV level for the actual programming operation, which can lead to errors in the data stored in the memory cell (for example, the state of the memory cell can be higher than the target state). In such cases, PFP pulse levels are determined by program speed related to the programming process. As an example, the difference between the higher bound of the VT level following the PFP cycle ("PFP_VT_HB"), and the higher bound of the VT level following the PGM cycle ("PGM_VT_HB") can be in the range of 0 volts (V) to 1.2 V, as noted by equation (1) below. A lower value of the difference can be better for the window achieved in obtaining the VT level, but at a greater risk of over-programming.

$$PGM\_VT\_HB - PFP\_VT\_HB = 0V \sim 1.2V \quad (1)$$

In this manner, the memory controller selects PFP pulses that are optimized for the corresponding VT level.

Figure 3:
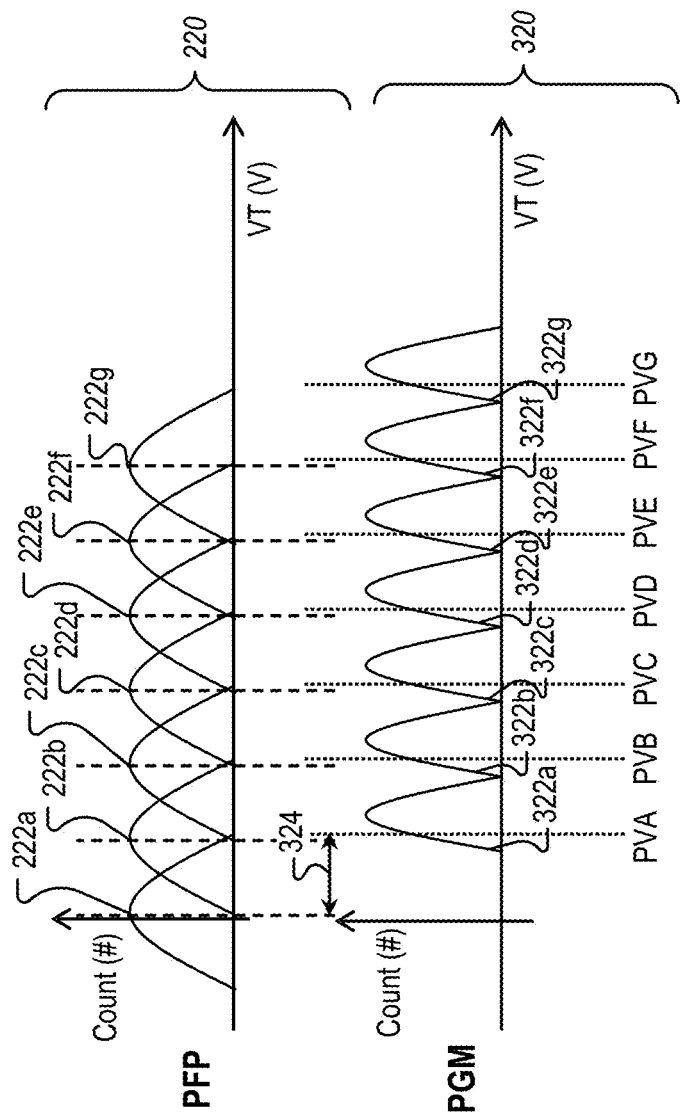
FIG. 3 illustrates a comparison between voltage levels for a pre-filled program (PFP) cycle and the corresponding conventional program (PGM) cycle.

FIG. 3 illustrates a comparison between voltage levels for a pre-filled program (PFP) cycle and the corresponding conventional program (PGM) cycle. The VT distribution graph 220 corresponds to the PFP cycle 202, as described above. The VT distribution 320 illustrates distribution curves for VT levels for the different states for the PGM cycle 210. For example, VT curve 322a corresponds to the VT level distribution for state A at the end of the PV cycle for state A. Similarly, VT curves 322b, 322c, 322d, 322e, 322f, and 322g respectively correspond to the VT distribution for states B, C, D, E, F, and G, at the end of respective PV cycles. As shown, for each state, the PFP pulse level is close to, but less than, the corresponding VT level for that state. For example, for state A, the difference between the PFP pulse level (given by curve 222a) and the VT level (given by curve 322a) is illustrated by margin 324, which indicates that the PFP pulse level is less than that corresponding VT level. Similarly, the PFP levels for each of the other states are less than the corresponding VT levels.

Figure 4A:
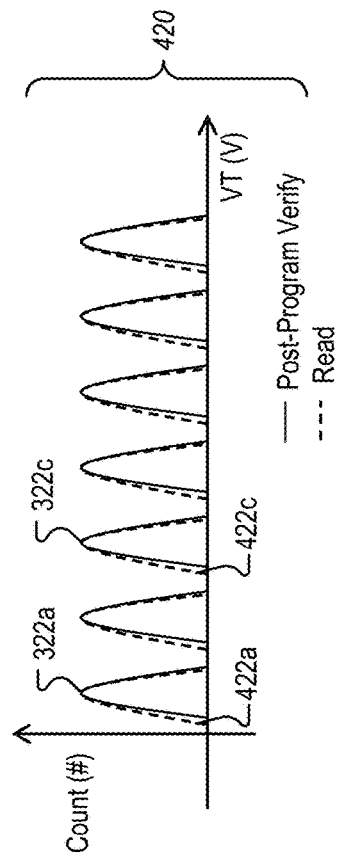
FIGS. 4A and 4B provide examples illustrating threshold voltage (VT) distribution upon memory programming using the disclosed techniques with a pre-filled program (PFP) cycle preceding a conventional program (PGM) cycle, and memory programming using conventional programming only, respectively.
Figure 4A:
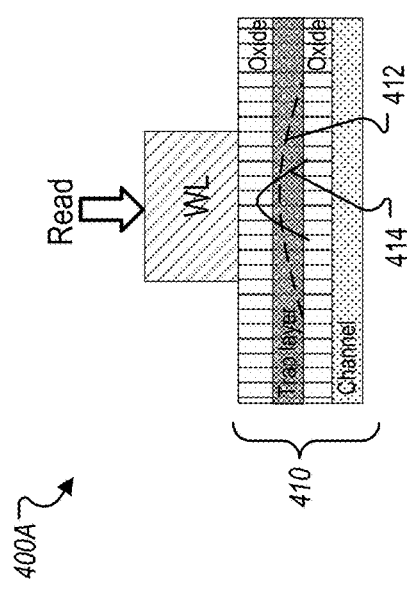
Figure 4B:
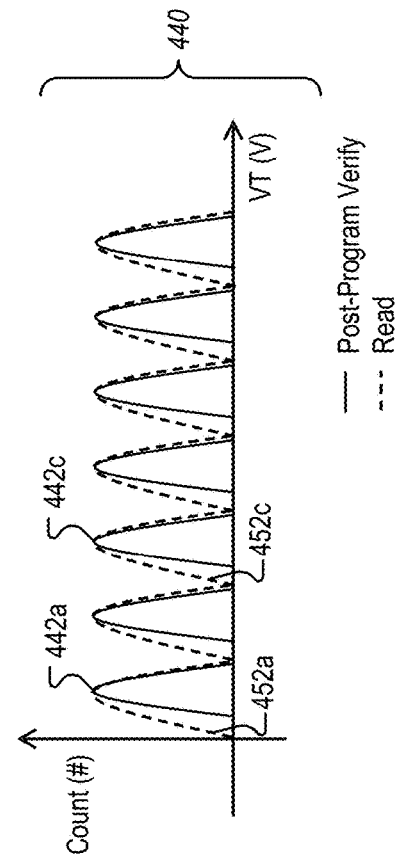
Figure 4B:
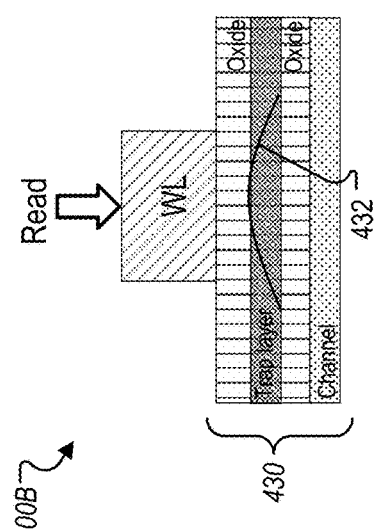

FIGS. 4A and 4B provide examples illustrating threshold voltage (VT) distribution upon memory programming using the disclosed techniques with a pre-filled program (PFP) cycle preceding a conventional program (PGM) cycle, and memory programming using conventional programming only, respectively. FIG. 4A shows a schematic diagram of the distribution of electrons in the semiconductor layers 410 of a memory cell 400A at the time of a read operation, following a programming cycle that includes a PFP cycle preceding a PGM cycle according to the disclosed techniques (for example, programming operation 200).

The curve 412 indicates the distribution of PFP electrons in the trapping layer of the memory cell between the oxide layers, after completion of the PFP cycle (for example, PFP cycle 202) in which one or more PFP pulses are applied to the memory cell to reach the VT level corresponding to the target program state. Curve 412 indicates that the PFP electrons have redistributed (spread out) in the trapping layer.

The curve 414 indicates the distribution of program electrons in the trapping layer, after completion of the programming cycle (for example, PGM cycle 210) in which one or more programming pulses are applied to the memory cell to store data in the memory cell at the target program state. Curve 414 indicates that the program electrons have redistributed (spread out) to a significantly lesser extent in the trapping layer compared to the PFP electrons. This is because the redistributed PFP electrons, which spread out earlier, resist the program electrons from redistributing due to electron repelling, and thus limiting target VT redistribution.

The VT distribution graph 420 illustrates distribution curves for VT levels in the memory cell 400A for the different states at (i) the completion of the program verify operation (post-program verify, or post-PV), and (ii) at the time of a read operation. For example, curve 322a corresponds to the post-PV VT distribution for state A, while curve 422a shows the VT distribution for state A during a subsequent read operation. The closeness of the curve 422a to the curve 322a indicates that the VT redistribution for the memory cell 400A is limited due to the application of PFP cycle. The VT distribution curves for the other states follow a similar pattern. For example, for state C, the VT distribution curve 422C at the time of a read operation is close to the corresponding post-PV VT distribution curve 322c.

FIG. 4B shows a schematic diagram of the distribution of electrons in the semiconductor layers 430 of a memory cell 400B at the time of a read operation, following a conventional programming operation that does not include a PFP cycle. The curve 432 indicates the distribution of program electrons in the trapping layer, after completion of the conventional programming. The curve 432 indicates that the program electrons have redistributed (spread out) in the trapping layer; comparison of the curve 432 to the curve 414 for the program electrons in the memory cell 400A illustrate that the program electrons for the memory cell 400B have redistributed to a significantly greater extent compared to the program electrons for the memory cell 400A. This is because there are no PFP electrons in the trapping layer of the memory cell 400B to resist the program electrons from redistributing, since the conventional programming operation for the memory cell 400B does not include a PFP cycle.

The VT distribution graph 440 illustrates distribution curves for VT levels in the memory cell 400B for the different states at (i) the completion of the program verify operation (post-PV), and (ii) at the time of a read operation. For example, curve 442a corresponds to the post-PV VT distribution for state A, while curve 452a shows the VT distribution for state A during a subsequent read operation. The curve 452a diverges from the curve 442a by a greater margin compared to the divergence of the curve 422a from the curve 322a for the memory cell 400A. The increased divergence for curves 442a and 452a, compared to that for curves 322a and 422a, indicates that the VT level for the memory cell 400B has redistributed post-PV to a greater extent compared to the corresponding post-PV VT level redistribution for the memory cell 400A. The redistribution in the latter case is limited due to the application of PFP cycle. The VT distribution curves for the other states follow a similar pattern. For example, for state C, the VT distribution curve 452C at the time of a read operation diverges from the post-PV VT distribution curve 442c by a greater margin compared to the corresponding levels for state C for the memory cell 400A, as shown by curves 322c and 422c.

In the implementations above, a separate PFP pulse is applied for each state of a memory cell, as described above.

Figure 5:
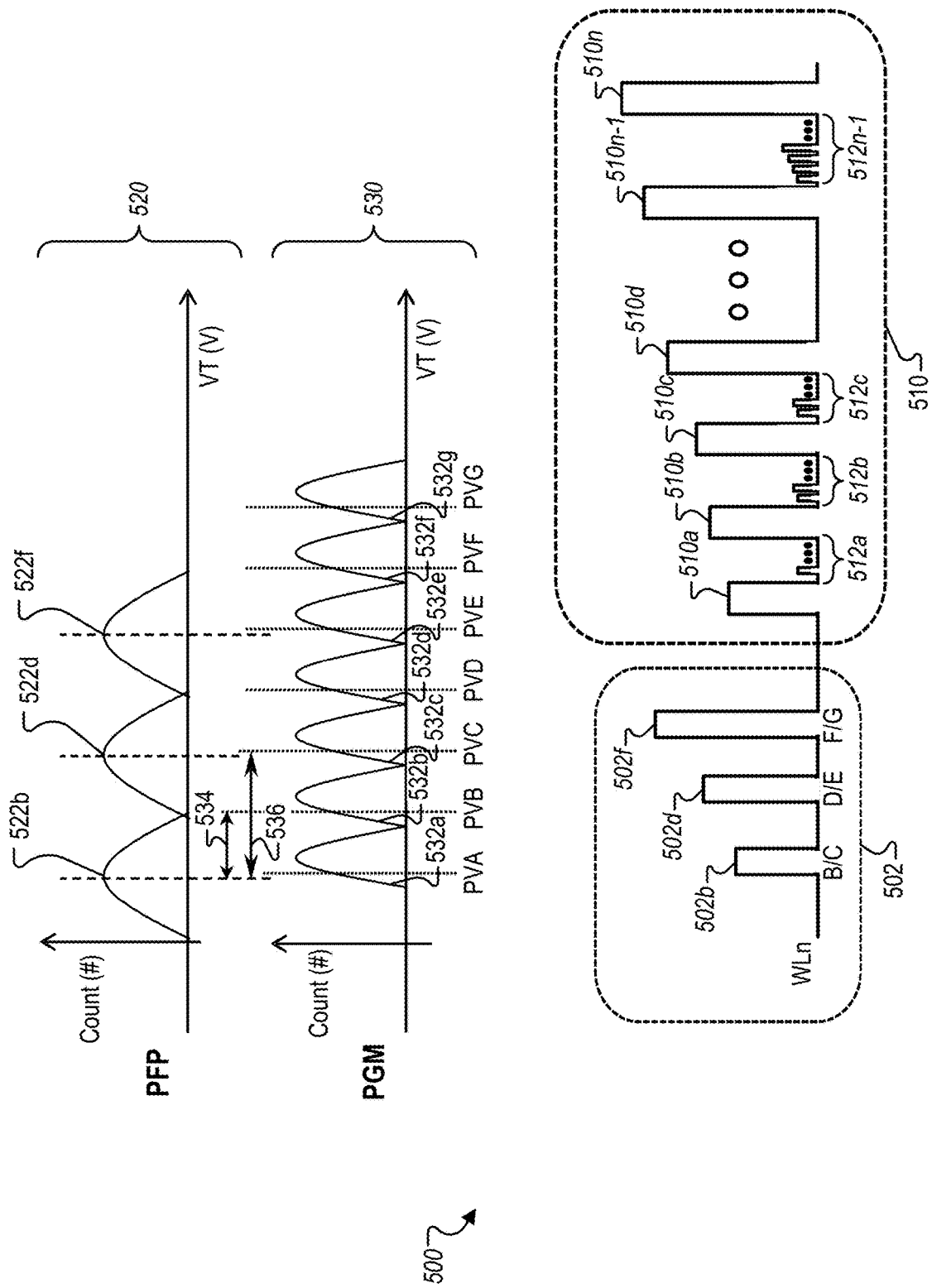
FIG. 5 illustrates an example of a memory programming operation with a pre-filled program (PFP) cycle preceding a conventional program (PGM) cycle, according to some implementations.

In some implementations, one PFP pulse is applied for two or more states of a memory cell. In such cases, when applying a PFP pulse for a particular state of the memory cell, one or more higher memory cell states (states that are at higher VT levels) can also be pre-fill programmed using the same PFP pulse. For example, when applying the PFP pulse for state B, state C can also be pre-fill programmed. Such multi-state PFP pulses can be useful in some cases to improve performance, since a lesser number of PFP pulses are used to reach the target state, which lowers the time for the PFP cycle. FIG. 5 illustrates an example of a memory programming operation 500 with a pre-filled program (PFP) cycle 502 preceding a conventional program (PGM) cycle 510. In some implementations, the programing operation 500 is performed by the memory controller 112 to program data to one or more memory cell of a target memory location in the storage array 114 upon receiving a program command from the host device 120, and the following descriptions are with respect to operations performed by the memory controller 112. However, in other implementations, the programming operation 500 may be performed by other hardware and/or software in a system associated with a memory array that is programmed.

As shown in FIG. 5, the PFP cycle 502 precedes the PGM cycle 510 in the programming operation 500. In the PFP cycle 502, each PFP pulse is used for two states of a memory cell. For example, PFP pulses 502b, 502d and 502f are used respectively for states B and C combined, D and E combined, and F and G combined. In this example, no PFP pulse is used for states 1 and A combined. The PGM cycle 510 is similar to the PGM cycle 210, with application of programming pulses 510a, 510b, 510c, 510d, 510n-1, and 510n, each followed by PV pulses, e.g., 512a, 512b, 512c and 512n-1.

In some cases, greater flexibility can be achieved by having combined PFP pulses for a smaller number of states than shown. For example, there can be combined PFP pulses 502d (states D and E) and 502f (states F and G), but no PFP pulses for states A, B, or C. The number of PFP pulses to have is a design choice, which can depend on the targeted trade off between performance and window.

To prevent over-programming for a state, the level of a combined PFP pulse for two or more states is configured to achieve a VT level of the memory cell after application of the PFP pulse that is close to, but less than, the PV level corresponding to the lowest state of the states that are combined. For example, the level of the PFP pulse 502b (which is for states B and C combined) is determined to be close to, but less than, the PV level of state B.

VT distribution graph 520 illustrates distribution curves for VT levels corresponding to the PFP cycle 502 for the different states. For example, PFP curves 522b, 522d, and 522f respectively represents the VT distribution for PFP pulses 502b, 502d, and 502f VT distribution 530 illustrates distribution curves for VT levels for the different states for the PGM cycle 510. For example, VT curves 532a, 532b, 532c, 532d, 532e, 532f, and 532g respectively correspond to the VT distribution for states A, B, C, D, E, F, and G, at the end of respective PV cycles. A comparison of the distribution graphs 520 and 530 show that a PFP pulse level is close to, but less than, the corresponding VT level for the lowest state corresponding to the PFP pulse. For example, for the PFP pulse 502b for states B and C combined, margin 534 illustrates the difference between the post-PFP VT level (given by curve 522b) and the post-PV VT level of state B (given by curve 532b), while margin 536 illustrates the difference between the post-PFP VT level (given by curve 522b) and the post-PV VT level of state C (given by curve 532c).

The margins 534 and 536 indicate that the post-PFP VT level for PFP pulse 502b is less than post-PV VT levels for states B and C, respectively. The margins 534 and 536 also indicate that the difference of the post-PFP VT level from the post-PV VT level for state B is less than the difference from the post-PV VT level for state C (which is higher than state B), which shows that the PFP pulse level is closer to (but less than) the PV VT level for the lower state (state B), but farther from the PV VT level for the higher state (state C). In this example, the PFP pulse 502b VT level is set such that state B is not over-programmed. State C is also not over-programmed, since the PFP pulse 502b level is further lower than the VT level of state C.

By having the VT level for the PFP pulse to be less than the lowest PV VT level for the combined states, over-programming of the lowest state is avoided. In doing so, however, the VT level for the PFP pulse is farther from the PV VT level for the higher state (for example, state C). Accordingly, the post-PV VT distribution for state C can be wider compared to that for state B, which can cause the read operation for state C to be less precise in some cases.

The programming operation 500 above illustrates an implementation in which a combined PFP pulse is used for two states of a memory cell. In some implementations, a combined PFP pulse is applied for more than two states of a memory cell. In such cases, a PFP pulse for a particular state of the memory cell can be used to pre-fill program all the higher states of the memory cell states using the same PFP pulse. For example, when applying the PFP pulse for state B, states C, D, E, F and G can also be pre-fill programmed.

In some implementations, the number of memory cell states that are pre-fill programmed using a PFP pulse is modifiable depending on a programming option. For example, depending on the selection of different programming options, a PFP pulse can be used to pre-fill program: state A only; states A and B; or states A, B, and C, among other suitable combinations.

In some implementations, during a programming operation, there is a finite delay between the end of the PFP cycle and the beginning of the associated PGM cycle. In such implementations, the memory controller waits for a finite amount of time after completing the PFP cycle, before performing the PGM cycle. For example, for programming operation 200A or 200B, memory controller 112 waits for a finite amount of time respectively between PFP cycle 202 and PGM cycle 210, or between PFP cycle 242 and PGM cycle 250. Similarly, for programming operation 500, memory controller 112 waits for a finite amount of time between PFP cycle 502 and PGM cycle 510. The wait time allows the PFP electrons to redistribute in the trapping layer. In some cases, the wait time is in the order of tens of microseconds or milliseconds.

The memory controller can program a series of memory units (for example, in units of memory blocks, sub-blocks, or pages) by selecting different sequences of the memory units in different implementations. FIGS. 6A-6D illustrate examples of different sequences of memory unit selection during programming operations involving pre-filled program (PFP) cycles. In some implementations, the different illustrated sequences are used by the memory controller 112 during any of the program operations 200A, 200B, or 500.

FIG. 6A illustrates a sequence 600A in which the memory controller completes a pre-filled program (PFP) cycle and the associated conventional program (PGM) cycle on the same word line before proceeding to the next word line. The figure shows three different word lines WL0, WL1 and WLn for a memory array, for example, memory storage array 114. Memory blocks 602_0, 602_1 and 602_n are associated with word lines WL0, WL1 and WLn, respectively. When using the sequence 600A, the memory controller completes the programming operation on a memory block associated with a word line (for example, perform the PFP cycle on a memory block followed by the PGM cycle on the same memory block), before moving on to a different memory block associated with another word line. For example, memory controller 112 performs PFP cycle 604_0 on memory block 602_0 associated with word line WL0, waits for a finite amount of time upon completion of the PFP cycle 604_0, and then performs PGM cycle 606_0 on memory block 602_0.

After completing both PFP cycle and PGM cycle on the memory block 602_0, the memory controller proceeds to program the next targeted memory block, for example, memory block 602_1 associated with word line WL1, completing PFP cycle 604_1 followed by PGM cycle 606_1, before proceeding to the next targeted memory block. Following this approach in sequence 600A, when memory block 602_n associated with word line WLn is programmed, memory controller performs PFP cycle 604_n followed by PGM cycle 606_n on the memory block, as shown. Memory controller waits for a finite amount of time between PFP cycle 604_1 and PGM cycle 606_1, and between PFP cycle 604_n and PGM cycle 606_n.

In some implementations, the memory controller utilizes the wait time period between a PFP cycle and the associated PGM cycle, to pre-fill program a different targeted memory block. The memory controller utilizes the wait time period in such implementations, rather than staying idle. The performance of the memory programming operation can be improved in doing so, for example, by reducing the overall time for the operation. Sequence 600B illustrates one such implementation. In the sequence 600B, upon completion of the PFP cycle 604_0 on memory block 602_0, the memory controller 112 utilizes the wait time before conventional programming can be done on memory block 602_0, to perform the PFP cycle on another target memory block. For example, as shown, after PFP cycle 604_0 on memory block 602_0, the memory controller immediately proceeds to perform PFP cycle 604_1 on memory block 602_1, and then returns to perform PGM cycle 606_0 on memory block 602_0. After the PGM cycle 606_0, the memory controller performs the PGM cycle 606_1 on memory block 602_1. In this manner, the memory controller utilizes the wait time for other PFP operations, leading to an overall reduction in the programming time.

Other permutations on the order of performing PFP cycles and PGM cycles on memory blocks are possible. For example, in some cases, after PGM cycle 606_0, memory controller 112 performs PFP cycle on the next target memory block, and then reverts to perform the PGM cycle 606_1 on memory block 602_1.

In some cases, memory controller 112 performs PFP cycles on three or more memory blocks in succession, before performing PGM cycles on these memory blocks. For example, after PFP cycle 604_1 on memory block 602_1, the memory controller can perform PFP cycle on one or more other targeted memory block(s), before returning to perform the PGM cycle 606_0 on memory block 602_0.

The number of memory blocks that are addressed in consecutive PFP cycles can depend on the wait time. Longer wait times can allow the memory controller to perform PFP operations on a greater number of memory blocks consecutively, while shorter wait times can enable consecutive PFP operations on a lower number of memory blocks.

While the examples of memory programming operations for sequences 600A and 600B are described at the granularity of memory blocks, the memory controller can use different sequences at the granularity of sub-blocks or pages. For example, each of the memory blocks 602_0, 602_1 and 602_n in FIGS. 6A-6D includes memory units Unit0, Unit1, Unit2 and Unit3. The memory units can be sub-blocks or pages. The numerical labels 1, 2, 3, 4, . . . 15, 16, and so on, in the PFP and PGM columns indicate the order in which the memory controller performs PFP cycle and PGM cycle on the memory units in the memory blocks. For the sequences 600A and 600B as shown, during the PFP cycles and the PGM cycles on the memory blocks, the memory controller performs PFP and PGM operations on the constituent memory units of memory block 602a in the chronological order of Unit1, Unit0, Unit2 and Unit3. The differences in permutations for the sequences 600A and 600B are at the level of the memory blocks. However, the memory controller can use different sequences at the level of the memory units in some cases.

Figure 6D:
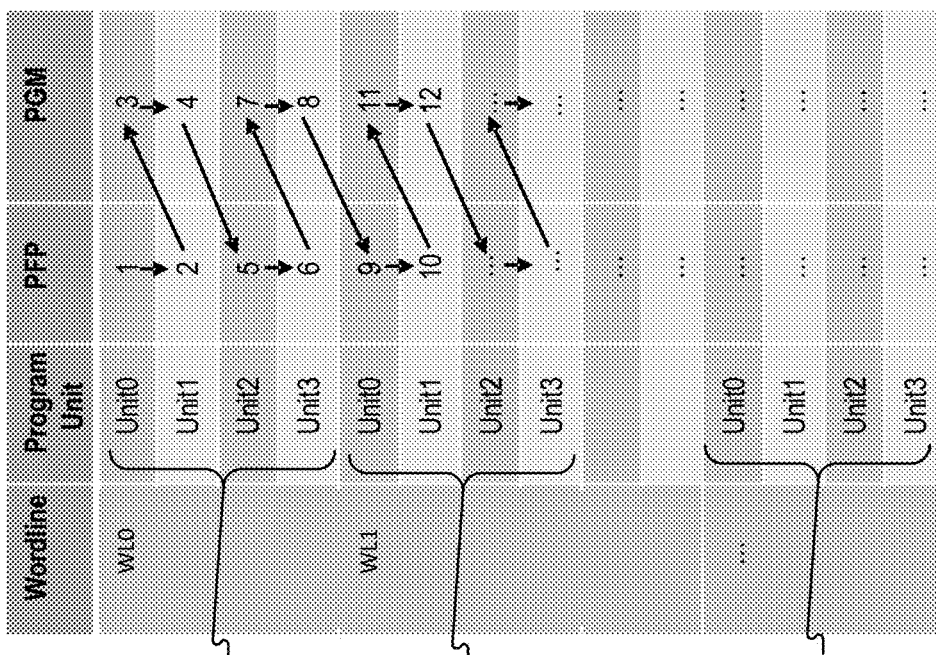
Figure 6C:
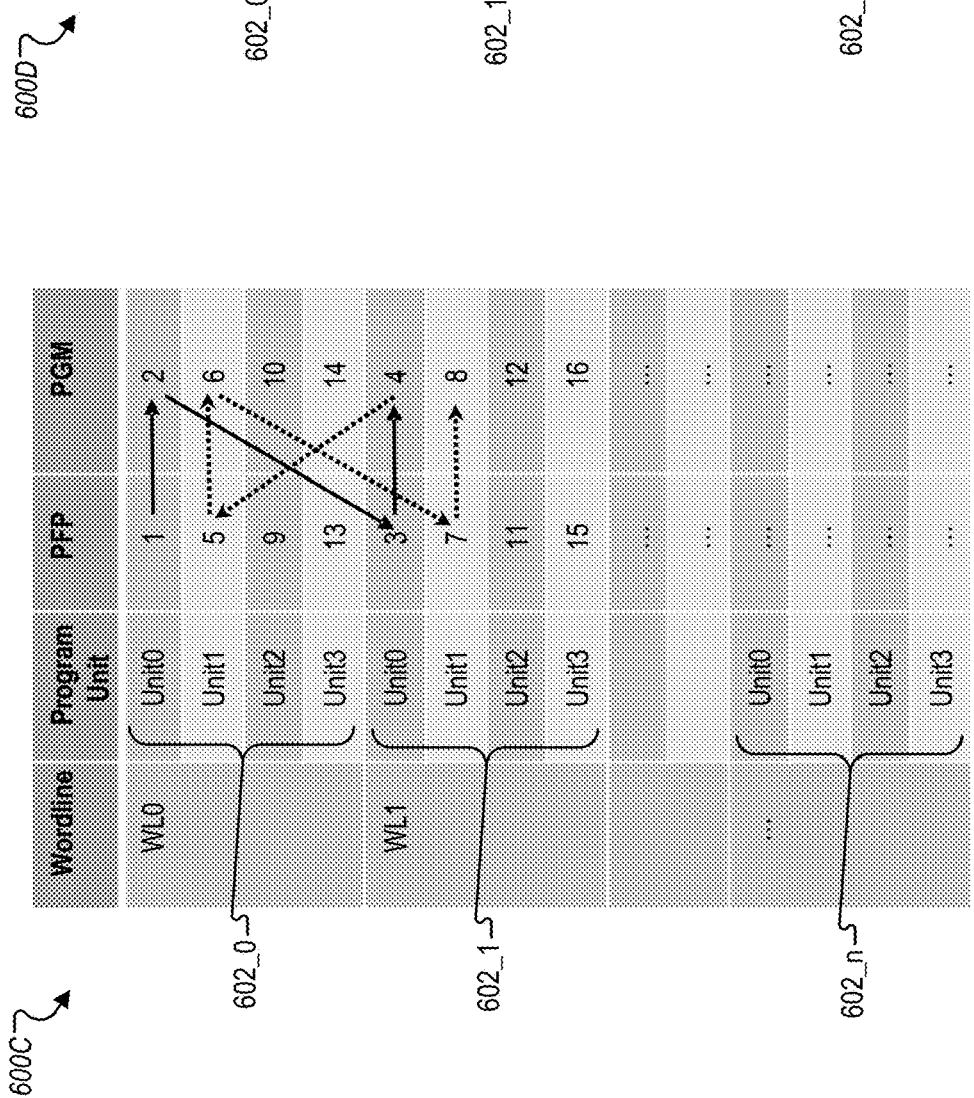

FIGS. 6C and 6D illustrate sequences 600C and 600D in which the memory controller uses different permutations of PFP cycle and associated PGM cycle at the granularity of the memory units, which can be memory sub-blocks or memory pages. When using the sequence 600C, the memory controller completes a PFP cycle and the associated PGM cycle on the same memory unit (a memory sub-block or a memory page) before proceeding to a next memory unit, which can be in a different memory block. The example of sequence 600C illustrates that the memory controller performs a memory programming operation at the granularity of memory units in the following chronological order:

PFP cycle (numerical label 1) followed by PGM cycle (numerical label 2) on Unit0 of memory block 602_0;
PFP cycle (3) followed by PGM cycle (4) on Unit0 of memory block 602_1;
PFP cycle (5) followed by PGM cycle (6) on Unit1 of memory block 602_0;
PFP cycle (7) followed by PGM cycle (8) on Unit1 of memory block 602_1, and so on.

In contrast to the sequence 600C, in some implementations, upon completion of a PFP cycle on a memory unit, the memory controller utilizes the wait time to perform a PFP cycle on one or more other memory units, before performing programming operations upon completion of the wait time period. For example, the example of sequence 600D illustrates that the memory controller performs a memory programming operation at the granularity of memory units in the following chronological order:

PFP cycle (1) on Unit0 of memory block 602_0;
PFP cycle (2) on Unit1 of memory block 602_0;
PGM cycle (3) on Unit0 of memory block 602_0;
PGM cycle (4) on Unit1 of memory block 602_0;
PFP cycle (5) on Unit2 of memory block 602_0;
PFP cycle (6) on Unit3 of memory block 602_0;
PGM cycle (7) on Unit2 of memory block 602_0;
PGM cycle (8) on Unit3 of memory block 602_0;
PFP cycle (9) on Unit0 of memory block 602_1;
PFP cycle (10) on Unit1 of memory block 602_1;
PGM cycle (11) on Unit0 of memory block 602_1;
PGM cycle (12) on Unit1 of memory block 602_1; and so on.

The illustrated example of sequence 600D shows that, in some cases, the memory controller interleaves the PFP and PGM cycles for adjacent memory units within a memory block to utilize the wait time. Other permutations are also possible. For example, in some cases, the memory controller can interleave PFP and PGM cycles for non-adjacent memory units within a memory block (for example, memory units Unit0 and Unit2 in memory block 602_0), or interleave PFP and PGM cycles for memory units in different memory blocks (for example, memory unit Unit0 in memory block 602_0 and Unit0 in memory block 602_1). In some cases, the memory controller can perform PFP cycles on three or more memory units within a memory block in succession, before performing PGM cycles on these memory units. In some cases, the memory controller can perform PFP cycles on memory units in two or more memory blocks in succession, before performing PGM cycles on these memory units. Other suitable permutations are also possible.

Figure 7:
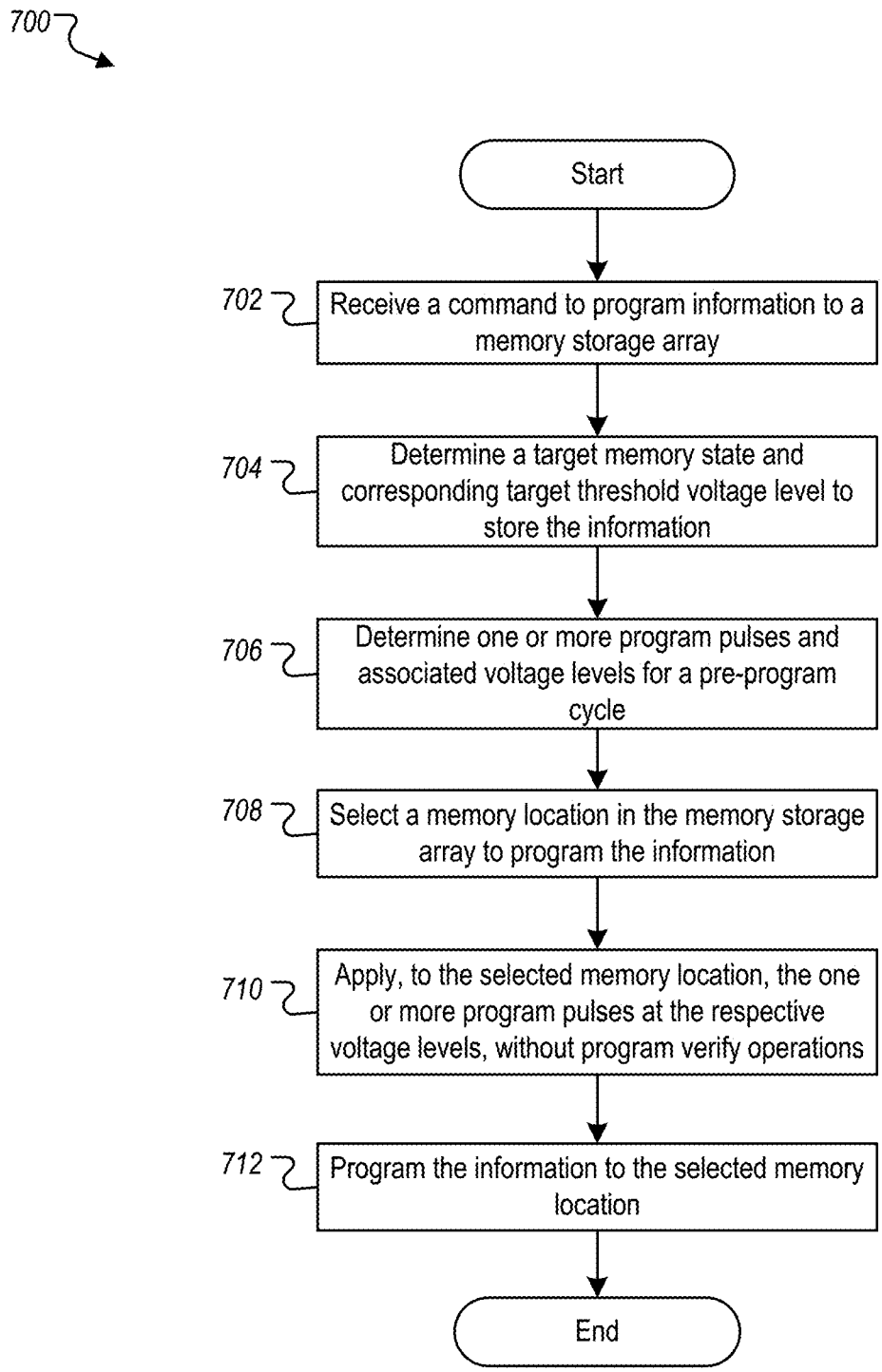
FIG. 7 illustrates an example of a process used by a memory controller to program data to a memory storage array using a programming operation with a pre-filled program (PFP) cycle preceding a conventional programming (PGM) cycle.

FIG. 7 illustrates an example of a process 700 used by a memory controller to program data to a memory storage array using a programming operation with a pre-filled program (PFP) cycle preceding a conventional programming (PGM) cycle. In some implementations, the process 700 is performed by the memory controller 112 to program data to one or more target memory cells in the storage array 114 upon receiving a program command from the host device 120. Accordingly, the process 700 is described in the following sections with respect to operations performed by the memory controller 112. However, the process 700 may also be performed by other hardware and/or software in a system associated with a memory array that is programmed. In some implementations, the operations described with respect to the process 700 correspond to the memory programming operation 200A, 200B, or 500.

The process 700 starts when the memory controller receives a command to program information to a memory storage array (702). For example, the memory controller 112 receives a program command from the host device 120 to write data to the memory device 110.

Upon receiving the program command, the memory controller determines a target memory state and corresponding target threshold voltage (VT) level to store the information or data specified by the program command (704). For example, the program command can be to write data that includes bit value "010." In this case, the memory controller determines that the target memory state to write bit value "010" is the third state or state B for a TLC memory cell, and accordingly determines the post-PV VT level for state B as the target VT level.

Upon determining the target memory state and corresponding target threshold voltage level, the memory controller determines one or more program pulses and associated voltage levels for a pre-program cycle of the programming operation for the program command (706). For example, the memory controller 112 determines one or more PFP pulses based on the target VT level for the program command, as described with respect to the programming operation 200A, 200B, or 500.

The memory controller selects a memory location in the memory storage array to program the information (708). For example, the memory controller 112 selects one or more memory blocks or memory units (for example, memory sub-blocks or memory pages) to program the data for the programming operation 200A, 200B, or 500.

The memory controller applies, to the selected memory location, the one or more program pulses at the respective voltage levels, without program verify operations (710). For example, the memory controller 112 performs the memory programming operation 200A on the target memory location. As part of the memory programing operation 200A, the memory controller performs the PFP cycle 202 on one or more memory cells of the target memory location. In the PFP cycle 202, the memory controller 112 applies one of the PFP pulses 202a, 202b, 202c, 202f, or 202g, to pre-fill program the memory cells to a VT level that is close to, but less than, the post-PV VT level for the target state. As another example, the memory controller 112 performs the memory programming operation 200B on the target memory location, in which the memory controller performs the PFP cycle 242 on one or more memory cells of the target memory location. In the PFP cycle 242, the memory controller 112 applies one or more PFP pulses (for example, one or more of PFP pulses 242a, 242b, 242c, 242f, or 242g) in stepwise operations, to pre-fill program a memory cell to a VT level that is close to, but less than, the post-PV VT level for the target state, by incrementally increasing the VT level of the memory state. As yet another example, the memory controller 112 performs the memory programming operation 500 on the target memory location, in which the memory controller performs the PFP cycle 502 on one or more memory cells of the target memory location. In the PFP cycle 502, the memory controller 112 applies one or more combined PFP pulses (for example, PFP pulses 502b, 502d, or 502f) to pre-fill program the memory cells to a VT level that is close to, but less than, the post-PV VT level for the plurality of target states. As described previously, the PFP pulses in the PFP cycle 200A, 200B or 500 are applied without program verify.

After performing the PFP cycle on the selected memory location, the memory controller programs the information indicated by the program command to the selected memory location (712). For example, when performing the memory programming operation 200A or 200B on the target memory location, the memory controller 112 performs the PGM cycle 210 or 250, respectively, after the PFP cycle 202 or 242, respectively, to program data in the one or more memory cells of the target memory location. As another example, when performing the memory programming operation 500 on the target memory location, the memory controller 112 performs the PGM cycle 510 following the PFP cycle 502, to program data in the one or more memory cells of the target memory location. As described previously, the PGM cycles 210, 250 or 510 include conventional programming operations in which the program pulses are followed by program verify.

It is to be noted that although process steps, method steps, algorithms or the like may be described in a sequential order above, such processes, methods and algorithms may generally be configured to work in alternate orders, unless specifically stated to the contrary.

The processes and logic flows described in this document can be performed by one or more programmable processors executing one or more computer programs to perform the functions described herein. The processes and logic flows can also be performed by, and apparatus can also be implemented as, special purpose logic circuitry, for example, an FPGA or an ASIC (application specific integrated circuit).

Processors suitable for the execution of a computer program include, by way of example, both general and special purpose microprocessors, and any one or more processors of any kind of digital computer. Computer readable media suitable for storing computer program instructions and data can include all forms of nonvolatile memory, media and memory devices. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method performed by a memory controller, the method comprising:
   receiving a command to program information to a memory storage array controlled by the memory controller;
   determining a plurality of target memory states to store the information, the plurality of target memory states including a first memory state and a second memory state;
   determining a plurality of target threshold voltage levels corresponding to the plurality of target memory states, the plurality of target threshold voltage levels including a first target voltage level corresponding to the first memory state and a second target voltage level corresponding to the second memory state, the second target voltage level being higher than the first target voltage level;
   determining, based at least on the plurality of target memory states, one or more program pulses for a pre-program cycle, the one or more program pulses including a combined program pulse for pre-programming the first memory state and the second memory state;
   computing, based at least on the plurality of target threshold voltage levels, voltage levels for the one or more program pulses, the computing comprising determining a first voltage level for the combined program pulse to be within a specified range of the first target voltage level that is less than the first target voltage level such that a threshold voltage of the selected memory location upon completion of the preprogramming is less than the first target voltage level and within the specified range of the first target voltage level;
   selecting a memory location in the memory storage array to program the information;
   pre-programming the selected memory location by applying the one or more program pulses at respective voltage levels, including applying the combined program pulse at the first voltage level to pre-program the memory location for the first memory state and the second memory state, the one or more program pulses applied without program verify operations; and
   following the pre-programming, programming the information to the selected memory location.

2. The method of claim 1, wherein programming the information to the selected memory location comprises applying one or more additional program pulses to the selected memory location to reach the second target voltage level, the one or more additional program pulses applied with respective accompanying program verify operations.

3. The method of claim 1, wherein the selected memory location includes a first memory block associated with a first word line and a second memory block associated with a second word line, and wherein pre-programming the selected memory location and programming the information to the selected memory location comprises:
   pre-programming the first memory block by applying the one or more program pulses at respective voltage levels, the one or more program pulses applied without program verify operations;
   following pre-programming the first memory block, programming the information to the first memory block;
   following programming the information to the first memory block, pre-programming the second memory block by applying the one or more program pulses at respective voltage levels, the one or more program pulses applied without program verify operations; and
   following pre-programming the second memory block, programming the information to the second memory block.

4. The method of claim 3, wherein each of the first memory block and the second memory block respectively comprises a plurality of first memory units and second memory units,
   wherein pre-programming and programming the first memory block and the second memory block comprises:
   pre-programming the plurality of first memory units by applying the one or more program pulses at respective voltage levels, the one or more program pulses applied without program verify operations;
   following pre-programming the plurality of first memory units, programming the information to the plurality of first memory units;
   following programming the information to the plurality of first memory units, pre-programming the plurality of second memory units by applying the one or more program pulses at respective voltage levels, the one or more program pulses applied without program verify operations; and
   following pre-programming the plurality of second memory units, programming the information to the plurality of second memory units.

5. The method of claim 1, further comprising:
   receiving a second command to program second information to the memory storage array;
   determining a third target memory state to store the second information, and a third target threshold voltage level corresponding to the third target memory state;
   determining, based at least on the third target memory state, one or more second program pulses for a second pre-program cycle, including determining voltage levels for the one or more second program pulses based at least on the third target threshold voltage level;

selecting a second memory location in the memory storage array to program the second information;

pre-programming the second memory location by applying the one or more second program pulses at respective voltage levels, the one or more second program pulses applied without program verify operations; and following the pre-programming, programming the second information to the second memory location.

6. The method of claim 5, wherein determining voltage levels for the one or more second program pulses based at least on the third target threshold voltage level comprises:

determining the voltage levels for the one or more program pulses to be within a specified range of the third target threshold voltage level.

7. A memory device comprising:

a memory storage array including a one or more memory blocks, with at least one of the memory blocks including one or more memory units;

a memory controller to manage access to the memory storage array, wherein the memory controller executes instructions stored in computer memory to perform operations comprising:

receiving a command to program information to the memory storage array;

determining a plurality of target memory states to store the information, the plurality of target memory states including a first memory state and a second memory state;

determining a plurality of target threshold voltage levels corresponding to the plurality of target memory states, the plurality of target threshold voltage levels including a first target voltage level corresponding to the first memory state and a second target voltage level corresponding to the second memory state, the second target voltage level being higher than the first target voltage level;

determining, based at least on the plurality of target memory states, one or more program pulses for a pre-program cycle, the one or more program pulses including a combined program pulse for pre-programming the first memory state and the second memory state;

computing, based at least on the plurality of target threshold voltage levels, voltage levels for the one or more program pulses, the computing comprising determining a first voltage level for the combined program pulse to be within a specified range of the first target voltage level that is less than the first target voltage level such that a threshold voltage of the selected memory location upon completion of the preprogramming is less than the first target voltage level and within the specified range of the first target voltage level;

selecting a memory location in the memory storage array to program the information;

pre-programming the selected memory location by applying the one or more program pulses at respective voltage levels, including applying the combined program pulse at the first voltage level to pre-program the memory location for the first memory state and the second memory state, the one or more program pulses applied without program verify operations; and following the pre-programming, programming the information to the selected memory location.

8. The memory device of claim 7, wherein programming the information to the selected memory location comprises applying one or more additional program pulses to the selected memory location to reach the second target voltage level, the one or more additional program pulses applied with respective accompanying program verify operations.

9. The memory device of claim 7, wherein the selected memory location includes a first memory block associated with a first word line and a second memory block associated with a second word line, and wherein pre-programming the selected memory location and programming the information to the selected memory location comprises:

pre-programming the first memory block by applying the one or more program pulses at respective voltage levels, the one or more program pulses applied without program verify operations;

following pre-programming the first memory block, programming the information to the first memory block;

following programming the information to the first memory block, pre-programming the second memory block by applying the one or more program pulses at respective voltage levels, the one or more program pulses applied without program verify operations; and following pre-programming the second memory block, programming the information to the second memory block.

10. The memory device of claim 9, wherein each of the first memory block and the second memory block respectively comprises a plurality of first memory units and second memory units, wherein pre-programming and programming the first memory block and the second memory block comprises:

pre-programming the plurality of first memory units by applying the one or more program pulses at respective voltage levels, the one or more program pulses applied without program verify operations;

following pre-programming the plurality of first memory units, programming the information to the plurality of first memory units;

following programming the information to the plurality of first memory units, pre-programming the plurality of second memory units by applying the one or more program pulses at respective voltage levels, the one or more program pulses applied without program verify operations; and following pre-programming the plurality of second memory units, programming the information to the plurality of second memory units.

11. The memory device of claim 7, wherein the operations further comprise:

receiving a second command to program second information to the memory storage array;

determining a third target memory state to store the second information, and a third target threshold voltage level corresponding to the third target memory state;

determining, based at least on the third target memory state, one or more second program pulses for a second pre-program cycle, including determining voltage levels for the one or more second program pulses based at least on the third target threshold voltage level;

selecting a second memory location in the memory storage array to program the second information;

pre-programming the second memory location by applying the one or more second program pulses at respective voltage levels, the one or more second program pulses applied without program verify operations; and following the pre-programming, programming the second information to the second memory location.

12. The memory device of claim 11, wherein determining voltage levels for the one or more second program pulses based at least on the third target threshold voltage level comprises:
determining the voltage levels for the one or more program pulses to be within a specified range of the third target threshold voltage level.

13. A memory controller comprising:
one or more processors; and
one or more non-transitory machine-readable media storing instructions that are executed by the one or more processors to perform operations comprising:
receiving a command to program information to a memory storage array in a memory device, the memory storage array managed by the memory controller;
determining a plurality of target memory states to store the information, the plurality of target memory states including a first memory state and a second memory state;
determining a plurality of target threshold voltage levels corresponding to the plurality of target memory states, the plurality of target threshold voltage levels including a first target voltage level corresponding to the first memory state and a second target voltage level corresponding to the second memory state, the second target voltage level being higher than the first target voltage level;
determining, based at least on the plurality of target memory states, one or more program pulses for a pre-program cycle, the one or more program pulses including a combined program pulse for pre-programming the first memory state and the second memory state;
computing, based at least on the plurality of target threshold voltage levels, voltage levels for the one or more program pulses, the computing comprising determining a first voltage level for the combined program pulse to be within a specified range of the first target voltage level that is less than the first target voltage level such that a threshold voltage of the selected memory location upon completion of the preprogramming is less than the first target voltage level and within the specified range of the first target voltage level;
selecting a memory location in the memory storage array to program the information;
pre-programming the selected memory location by applying the one or more program pulses at respective voltage levels, including applying the combined program pulse at the first voltage level to pre-program the memory location for the first memory state and the second memory state, the one or more program pulses applied without program verify operations; and
following the pre-programming, programming the information to the selected memory location.

14. The memory controller of claim 13, wherein programming the information to the selected memory location comprises applying one or more additional program pulses to the selected memory location to reach the second target voltage level, the one or more additional program pulses applied with respective accompanying program verify operations.

15. The memory controller of claim 13, wherein the selected memory location includes a first memory block associated with a first word line and a second memory block associated with a second word line, and wherein pre-programming the selected memory location and programming the information to the selected memory location comprises:
pre-programming the first memory block by applying the one or more program pulses at respective voltage levels, the one or more program pulses applied without program verify operations;
following pre-programming the first memory block, programming the information to the first memory block;
following programming the information to the first memory block, pre-programming the second memory block by applying the one or more program pulses at respective voltage levels, the one or more program pulses applied without program verify operations; and
following pre-programming the second memory block, programming the information to the second memory block.

16. The memory controller of claim 15, wherein each of the first memory block and the second memory block respectively comprises a plurality of first memory units and second memory units,
wherein pre-programming and programming the first memory block and the second memory block comprises:
pre-programming the plurality of first memory units by applying the one or more program pulses at respective voltage levels, the one or more program pulses applied without program verify operations;
following pre-programming the plurality of first memory units, programming the information to the plurality of first memory units;
following programming the information to the plurality of first memory units, pre-programming the plurality of second memory units by applying the one or more program pulses at respective voltage levels, the one or more program pulses applied without program verify operations; and
following pre-programming the plurality of second memory units, programming the information to the plurality of second memory units.

17. The memory controller of claim 13, wherein the operations further comprise:
receiving a second command to program second information to the memory storage array;
determining a third target memory state to store the second information, and a third target threshold voltage level corresponding to the third target memory state;
determining, based at least on the third target memory state, one or more second program pulses for a second pre-program cycle, including determining voltage levels for the one or more second program pulses based at least on the third target threshold voltage level;
selecting a second memory location in the memory storage array to program the second information;
pre-programming the second memory location by applying the one or more second program pulses at respective voltage levels, the one or more second program pulses applied without program verify operations; and
following the pre-programming, programming the second information to the second memory location.

18. The memory controller of claim 17, wherein determining voltage levels for the one or more second program pulses based at least on the third target threshold voltage level comprises:
determining the voltage levels for the one or more program pulses to be within a specified range of the third target threshold voltage level.

19. A method performed by a memory controller, the method comprising:

receiving a command to program information to a memory storage array controlled by the memory controller;

determining (i) a target memory state to store the information, and (ii) a target threshold voltage level corresponding to the target memory state;

determining, based at least on the target memory state, one or more program pulses for a pre-program cycle;

computing, based at least on the target threshold voltage level, voltage levels for the one or more program pulses;

selecting a memory location in the memory storage array to program the information, wherein the selected memory location includes a first memory block associated with a first word line and a second memory block associated with a second word line; and pre-programming the selected memory location and programming the information to the selected memory location, comprising:

pre-programming the first memory block by applying the one or more program pulses at respective voltage levels, the one or more program pulses applied without program verify operations;

following pre-programming the first memory block, programming the information to the first memory block;

following programming the information to the first memory block, pre-programming the second memory block by applying the one or more program pulses at respective voltage levels, the one or more program pulses applied without program verify operations; and following pre-programming the second memory block, programming the information to the second memory block.

20. The method of claim 19, wherein each of the first memory block and the second memory block respectively comprises a plurality of first memory units and second memory units, wherein pre-programming and programming the first memory block and the second memory block comprises:

pre-programming the plurality of first memory units by applying the one or more program pulses at respective voltage levels, the one or more program pulses applied without program verify operations;

following pre-programming the plurality of first memory units, programming the information to the plurality of first memory units;

following programming the information to the plurality of first memory units, pre-programming the plurality of second memory units by applying the one or more program pulses at respective voltage levels, the one or more program pulses applied without program verify operations; and following pre-programming the plurality of second memory units, programming the information to the plurality of second memory units.

21. The method of claim 19, wherein the voltage levels for the one or more program pulses are determined to be within a specified range of the target threshold voltage level that is less than the target threshold voltage level such that a threshold voltage of the selected memory location upon completion of the pre-programming is less than the target threshold voltage level and within the specified range of the target threshold voltage level.

\* \* \* \* \*